(12) United States Patent
Kwon et al.

(10) Patent No.: US 7,569,423 B2
(45) Date of Patent: Aug. 4, 2009

(54) WAFER-LEVEL-CHIP-SCALE PACKAGE AND METHOD OF FABRICATION

(75) Inventors: Yong-hwan Kwon, Suwon-si (KR); Chung-sun Lee, Anyang-si (KR); Woon-byung Kang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/139,771

(22) Filed: Jun. 16, 2008

(65) Prior Publication Data

US 2008/0242000 A1    Oct. 2, 2008

Related U.S. Application Data

(62) Division of application No. 11/444,410, filed on Jun. 1, 2006, now abandoned.

(30) Foreign Application Priority Data

Jul. 22, 2005    (KR) .................. 10-2005-0066960

(51) Int. Cl.
*H01L 21/48* (2006.01)
*H01L 23/34* (2006.01)

(52) U.S. Cl. ...................................... 438/114; 257/724

(58) Field of Classification Search ......... 257/723–724, 257/778, 790; 438/108–114
See application file for complete search history.

(56) References Cited

U.S. PATENT DOCUMENTS

| 6,376,279 | B1 * | 4/2002 | Kwon et al. ................. 438/113 |
| 6,743,660 | B2 * | 6/2004 | Lee et al. ..................... 438/108 |
| 6,914,332 | B2 | 7/2005 | Zuniga-Ortiz et al. |
| 6,939,789 | B2 | 9/2005 | Huang et al. |
| 6,984,866 | B1 | 1/2006 | Mostafazadeh et al. |
| 7,202,113 | B2 | 4/2007 | Sun et al. |
| 2003/0134496 | A1 | 7/2003 | Lee et al. |
| 2003/0137062 | A1 | 7/2003 | Akram et al. |
| 2003/0155638 | A1 | 8/2003 | Ito |
| 2007/0169343 | A1 | 7/2007 | Farnworth et al. |

FOREIGN PATENT DOCUMENTS

| JP | 2001127206 A | 5/2001 |
| JP | 2001308116 A | 11/2001 |
| JP | 2002270721 A | 9/2002 |
| JP | 2003078069 A | 3/2003 |
| JP | 2003309228 A | 10/2003 |
| KR | 1020010002843 A | 1/2001 |

* cited by examiner

*Primary Examiner*—Calvin Lee
(74) *Attorney, Agent, or Firm*—Volentine & Whitt, PLLC (57) ABSTRACT

A wafer-level-chip-scale package and related method of fabrication are disclosed. The wafer-level-chip-scale package comprises a semiconductor substrate comprising an integrated circuit, a conductive ball disposed on the semiconductor substrate and electrically connected to the integrated circuit, and a protective portion formed from an insulating material and disposed on bottom and side surfaces of the semiconductor substrate.

7 Claims, 7 Drawing Sheets

WAFER-LEVEL-CHIP-SCALE PACKAGE AND METHOD OF FABRICATION

CROSS-REFERENCE TO RELATED APPLICATION

This is a divisional of U.S. application Ser. No. 11/444,410, filed Jun. 1, 2006, which is incorporated herein by reference in its entirety.

BACKGROUND OF THE INVENTION

1. Field of the Invention

Embodiments of the invention relate to a wafer-level-chip-scale package and related method of fabrication. More particularly, embodiments of the invention relate to a relatively thinner and stronger wafer-level-chip-scale package and method of fabrication.

2. Description of the Related Art

The history of integrated circuit devices is characterized by ever increasing integration densities and continuing attempts to reduce their overall size. Wafer-level-chip-scale packages have been developed to produce smaller integrated circuit devices. Unlike other conventional semiconductor packages in which chips are individually packaged after being cut from a fabrication wafer, wafer-level-chip-scale packages are at least partially fabricated on the wafer (i.e., before cutting individual chip dies from the wafer).

Figure 1:
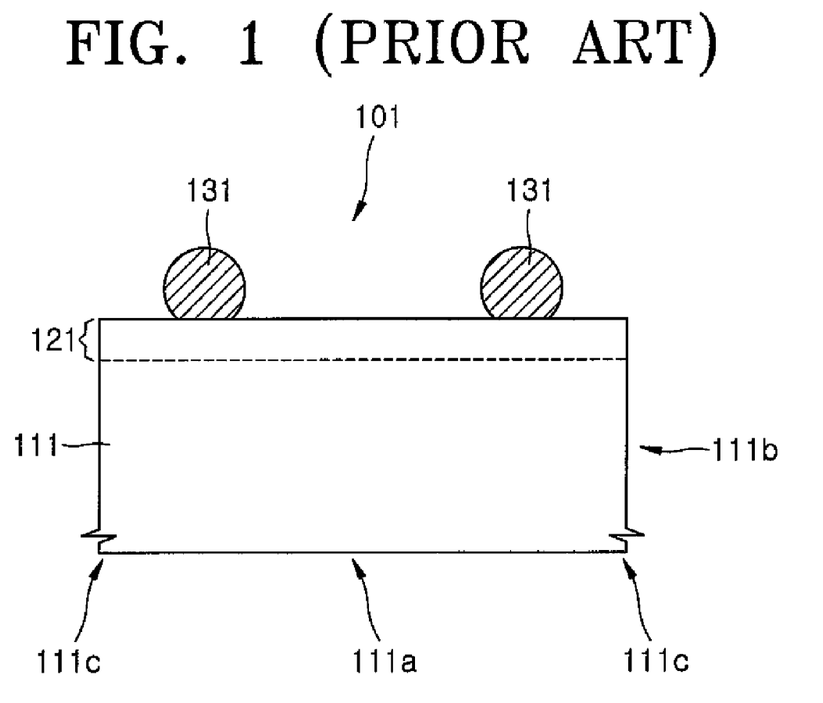
FIG. 1 is a sectional view of a conventional wafer-level-chip-scale package.

FIG. 1 is a sectional view of a conventional wafer-level-chip-scale package 101. Referring to FIG. 1, wafer-level-chip-scale package 101 includes a semiconductor substrate 111 and a plurality of solder balls 131 formed on a surface of semiconductor substrate 111.

An integrated circuit 121 may have been previously formed on semiconductor substrate 111 and is electrically connected to solder balls 131. Solder balls 131 are bonded to an external device (not shown), thereby allowing the external device to exchange electrical signals with integrated circuit 121 through an electrical connection provided through solder balls 131.

In the conventional wafer-level-chip-scale package 101, a bottom surface 111a and side surfaces 111b of semiconductor substrate 111 are exposed to the surrounding environment. Hence, bottom surface 111a, side surfaces 111b, and/or edges 111c of semiconductor substrate 111 may be broken by an external impact. In addition, when a constituent wafer is ultimately cut into separate wafer-level-chip-scale packages, wafer-level-chip-scale package 101 may be cracked by the cutting process. Such cracking often causes significant damage to the circuit formed on semiconductor substrate 111 and providing the functional capabilities of wafer-level-chip-scale package 101.

Semiconductor substrate 111 is most commonly formed from silicon, or a silicon based material. Silicon based materials are relatively easy to fracture. So, when wafer-level-chip-scale package 101 is formed too thinly, it is particularly easy to fracture. Thus, conventionally, there have been some very strict limits on the practical thinnest with which wafer-level-chip-scale package 101 may be formed.

SUMMARY OF THE INVENTION

Embodiments of the invention variously provides a thin wafer-level-chip-scale package having bottom and/or side surfaces that are less easily damaged by an external impact. Embodiments of the invention also provide a fabrication method adapted to provide such thin wafer-level-chip-scale packages.

In one embodiment, the invention provides a wafer-level-chip-scale package comprising; a semiconductor substrate comprising an integrated circuit, a conductive ball disposed on the semiconductor substrate and electrically connected to the integrated circuit, and a protective portion formed from an insulating material and disposed on bottom and side surfaces of the semiconductor substrate.

In another embodiment, the invention provides a method of fabricating a wafer-level-chip-scale package method comprising; preparing a wafer comprising a plurality of semiconductor substrates, each semiconductor substrate comprising an integrated circuit and a ball pad connected to the integrated circuit, attaching a temporary supporting board to a topside of the wafer, separating the plurality of semiconductor substrates on the temporary supporting board by selectively cutting a backside of the wafer while not cutting through the temporary supporting board, molding the backside of the wafer with an insulating material, removing the temporary supporting board, forming a conductive ball on the topside of the wafer in electrical contact with the ball pad, and cutting the insulating material to separate the plurality semiconductor substrates.

DESCRIPTION OF EXEMPLARY EMBODIMENTS

Several embodiments of the invention will now be described with reference to the accompanying drawings. The invention may, however, be embodied in many different forms and should not be construed as being limited to only the embodiments set forth therein. Rather, the embodiments are presented as teaching examples. Like reference numerals denote like elements throughout the specification.

Figure 2:
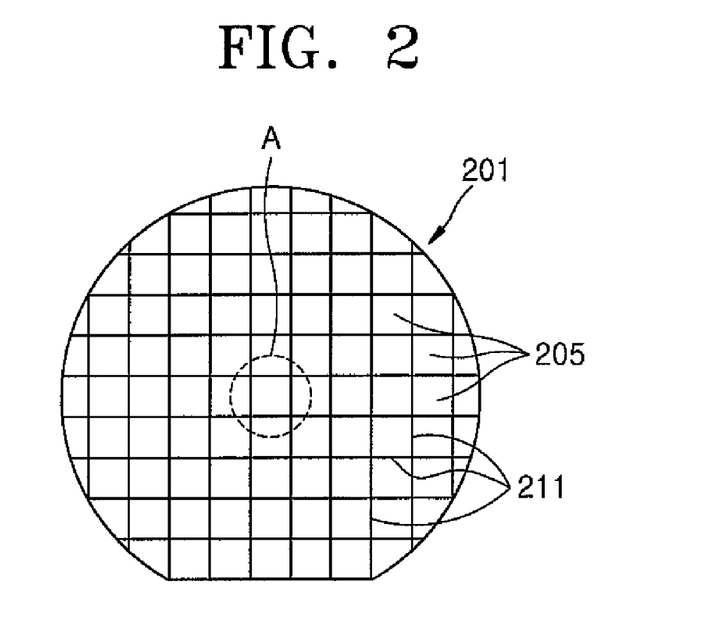
FIG. 2 is a schematic view of a wafer on which wafer-level-chip-scale packages are fabricated according to an embodiment of the invention.
Figure 3:
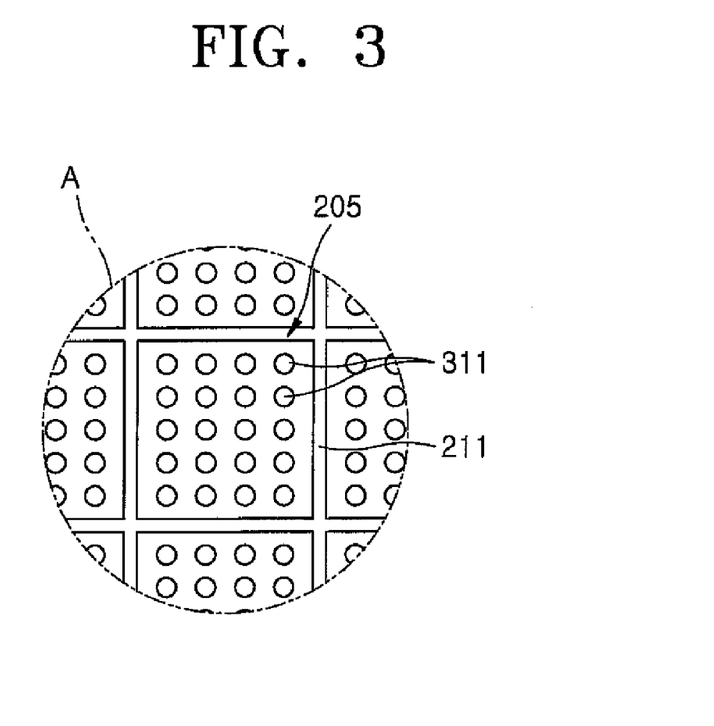
FIG. 3 is an enlarged view of a portion A indicated in FIG. 2.

FIG. 2 is a schematic view of a wafer 201 on which wafer-level-chip-scale packages may be fabricated according to an embodiment of the invention. FIG. 3 is an enlarged view of a portion A indicated in FIG. 2. Referring to FIGS. 2 and 3, a plurality of wafer-level-chip-scale packages 205 comprising various integrated circuits are fabricated on wafer 201 and are divided by subscribe lines 211. A plurality of balls 311 formed from a conductive material is selectively adhered to each wafer-level-chip-scale packages 205. Balls 311 may be used, for example, to bond wafer-level-chip-scale packages 205 to an external device (not shown), such that wafer-level-chip-scale packages 205 may exchange electrical signals with the external device. When wafer 201 is cut along subscribe lines 211, individual wafer-level-chip-scale packages 205 are separated from each other.

Figure 4:
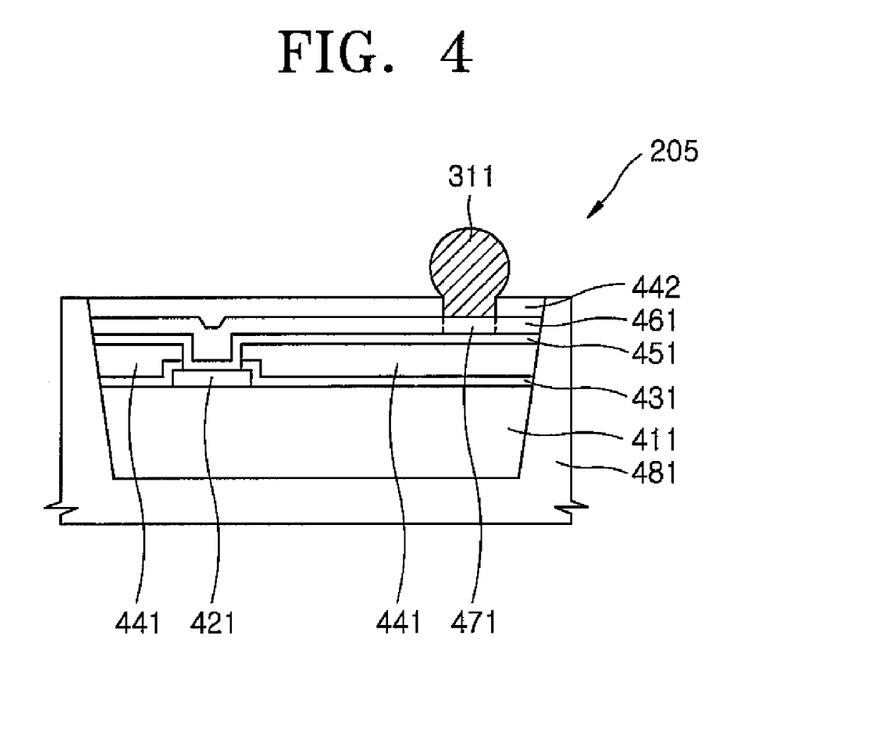
FIG. 4 is a sectional view of a wafer-level-chip-scale package according to an embodiment of the invention.

FIG. 4 is a sectional view of a wafer-level-chip-scale package 205 according to an embodiment of the invention. Referring to FIG. 4, wafer-level-chip-scale package 205 comprises a semiconductor substrate 411, a bonding pad 421, a protective layer 431, a first insulation layer 441, an under barrier metal 451, a distribution layer 461, a second insulation layer 442, a ball pad 471, a ball 311, and a protective portion 481.

Bonding pad 421 and protective layer 431 are sequentially formed on semiconductor substrate 411. Semiconductor substrate 411 will often include an integrated circuit (not shown) formed thereon and associated with bonding pad 421. In the illustrated embodiment, bonding pad 421 functions as an input and output terminal for electrical signals and may be formed from a conductive material, such as aluminium. Protective layer 431 may be formed from a variety of conventionally understood insulating materials, such as silicon oxide or silicon nitride. Protective layer 431 is adapted to protect the integrated circuit from the surrounding environment. In some embodiments, protective layer 431 is formed on edges of bonding pad 421. In FIG. 4, only a single bonding pad 431 is illustrated, but practical wafer-level-chip-scale packages 205 will include a great plurality of bonding pads 421.

First insulation layer 441 is formed on protective layer 431. First insulation layer 441 insulates protective layer 431 from under barrier metal 451 and provides a buffers from thermal stress. First insulation layer 441 may be formed from a polyimide, polybenzoxazole (PBO), benzocyclobutene (BCB), epoxy, or polymer.

Under barrier metal 451 is formed on bonding pad 421 and first insulation layer 441. Under barrier metal 451 improves the adhesion of subsequently formed distribution layer 461 and facilitates plating of distribution layer 461. Under barrier metal 451 may be formed from an alloy of metals, including for example, copper, nickel, and titanium. Under barrier metal 451 is adapted to electrically connect bonding pad 421 to distribution layer 461.

Distribution layer 461 is formed on under barrier metal 451. Distribution layer 461 may be formed from a material having good electrical conductivity, such as chrome, copper, nickel, titanium, tungsten, vanadium, palladium, aluminium, gold, or an alloy of the same.

Second insulation layer 442 is formed on distribution layer 461. Second insulation layer 442 is adapted to protect distribution layer 461 from the surrounding environment. Ball pad 471 is formed in a hole formed through second insulation layer 442.

Ball 311 is adhered to ball pad 471. Ball 311 may be formed from a conductive material such as lead or an Sn—Pb alloy. As ball 311 is bonded to an external device (not shown), wafer-level-chip-scale package 205 may exchange electrical signals with the external device through the electrical path formed through ball 311.

In FIG. 4, only a single ball pad 471 and ball 311 are illustrated. However, practical wafer-level-chip-scale packages 205 will include a plurality of ball pads 471 and a plurality of balls 311. A bottom and sides of the wafer-level-chip-scale package 205 are covered with protective portion 481. Protective portion 481 may be formed from a high-strength epoxy compound. Because the vulnerable bottom and side surfaces of wafer-level-chip-scale package 205 are covered by protective portion 481, they are far less likely to be damaged by an external impact.

In addition, when wafer 201 of FIG. 2 is cut to separate the individual wafer-level-chip-scale packages 205 from one another, cracking is less likely to form in the bottom and/or side surfaces of wafer-level-chip-scale package 205 due to the presence of protective portion 481. Therefore, wafer-level-chip-scale package 205 is not so easily fractured during this particular fabrication process.

FIGS. 5 through 14 are related sectional views illustrating a method of fabricating a wafer-level-chip-scale package according to an embodiment of the invention. FIGS. 5 through 14 illustrate cross-sections of an exemplary wafer portion.

Figure 5:
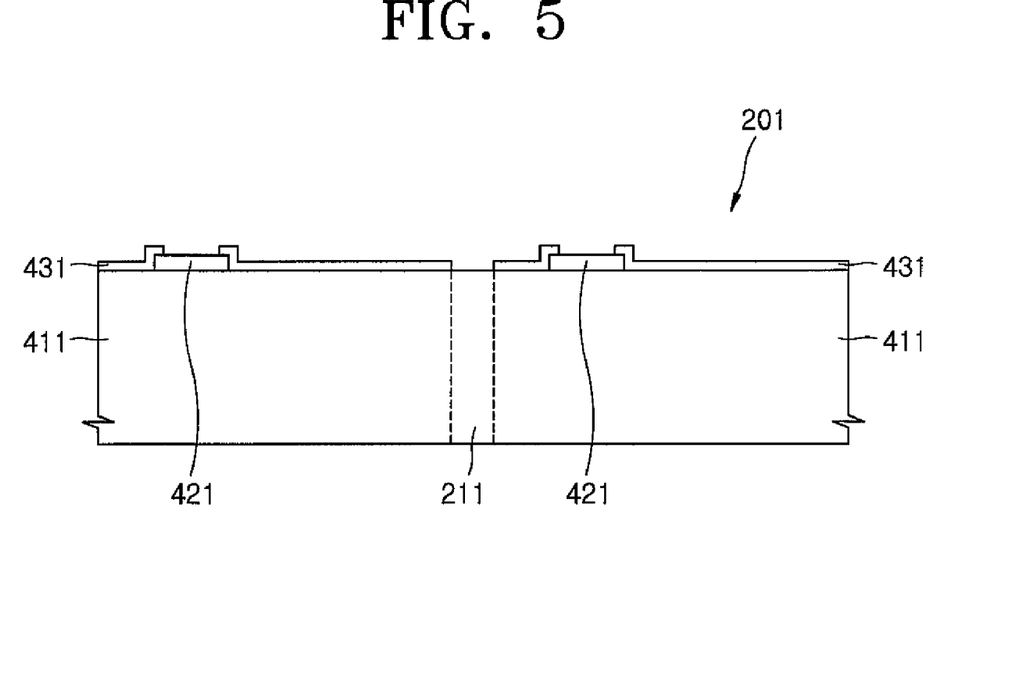
FIGS. 5 through 14 are related sectional views illustrating a fabrication method adapted to provide a wafer-level-chip-scale package according to an embodiment of the invention.

Referring to FIG. 5, bonding pads 421 and protective layers 431 are respectively formed on a plurality of semiconductor substrates 411. The plurality of semiconductor substrates 411 are formed on a wafer 201 and separated by subscribe lines 211. Using conventional methods, integrated circuits (not shown) are formed on the semiconductor substrates 411. Bonding pads 421 are electrically connected to these integrated circuits.

Protective layers 431 are formed on edges of bonding pads 421 and on semiconductor substrates 411 to protect the integrated circuits from the surrounding environment. Bonding pads 421 and protective layers 431 may be formed with the integrated circuits on wafer 201.

Figure 6:
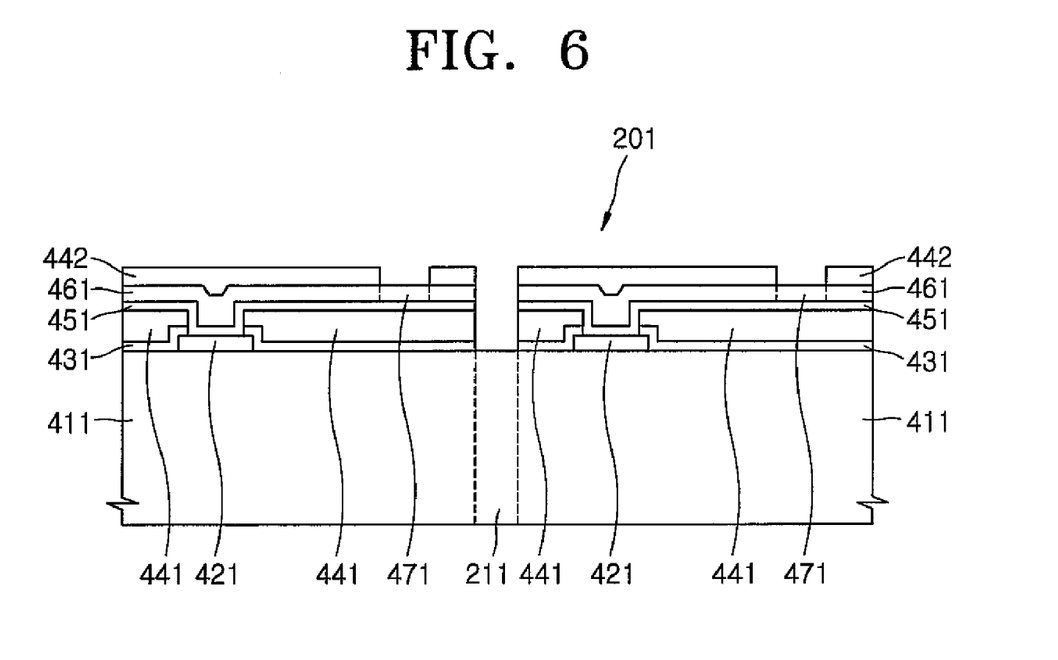

Referring to FIG. 6, first insulation layers 441, under barrier metals 451, distribution layers 461, second insulation layers 442, and ball pads 471 are sequentially formed on each semiconductor substrates 411.

Specifically, first insulation layers 441 are formed on protective layers 431. First insulation layers 441 may be formed using a spin coating method and a photo process.

Under barrier metals 451 may be formed by depositing titanium, chrome, copper, nickel, or an alloy of the same on semiconductor substrates 411 using a sputtering or evaporation method. Under barrier metals 451 may be patterned using first photosensitive layer patterns (not shown) formed thereon. After patterning under barrier metals 451, the first photosensitive layer patterns are removed.

Distribution layers 461 may be formed on patterned under barrier metals 451 and ball pads 471 by coating same with a selected metal. Distribution layers 461 may be formed from titanium and copper using a sputtering method or may be formed of copper and nickel using a plating method. Since distribution layers 461 may only be formed on under barrier layers 451 using a non-electrolysis plating method, an additional patterning process adapted to the formation of distribution layers 461 is not required.

Second insulation layers 442 are formed on semiconductor substrates 411 and patterned distribution layers 461. Second insulation layers 442 are adapted to protect distribution layers 461 from the surrounding environment.

Second photosensitive layer patterns (not shown) may be formed on second insulation layers 442 to expose a portion of each second insulation layers 442. Then, ball pads 471 are formed. After ball pads 471 are formed, second photosensitive layer patterns are removed. Photoresist may be used as the first and second photosensitive layer patterns.

Figure 7:
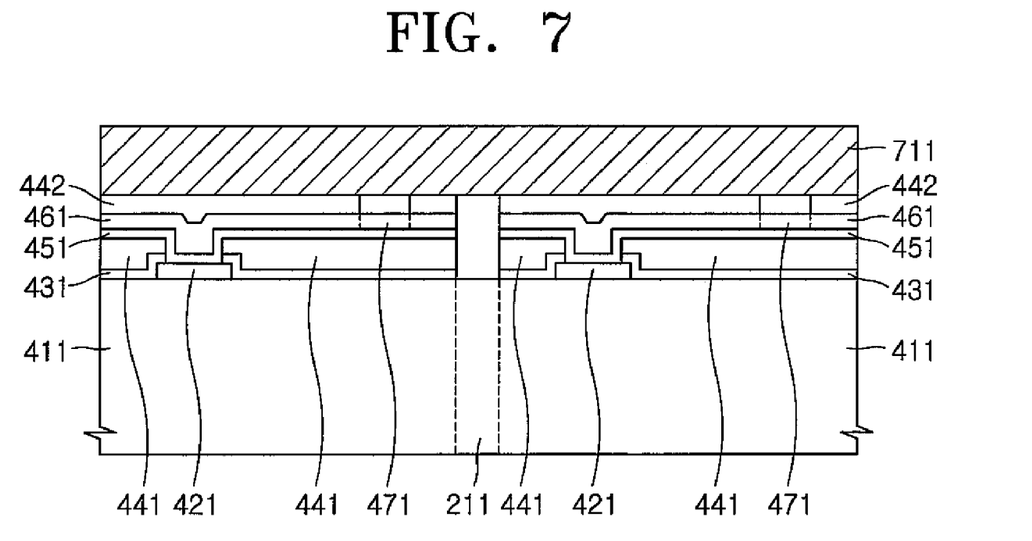

Referring to FIG. 7, a temporary supporting board 711 is attached to a topside of wafer 201. That is, the topside of wafer 201 is the side on which the integrated circuit, etc., are formed, as compared to the opposed backside of wafer 201. Since temporary supporting board 711 will be detached later, second insulation layer 422 should provide appropriate adhesive capabilities without causing damage to second insulation layer 442 during removal of temporary supporting board 711. Either a flexible member or a rigid member may be used as temporary supporting board 711. However, a rigid member has been found to better protect wafer 201 in many embodiments.

Figure 8:
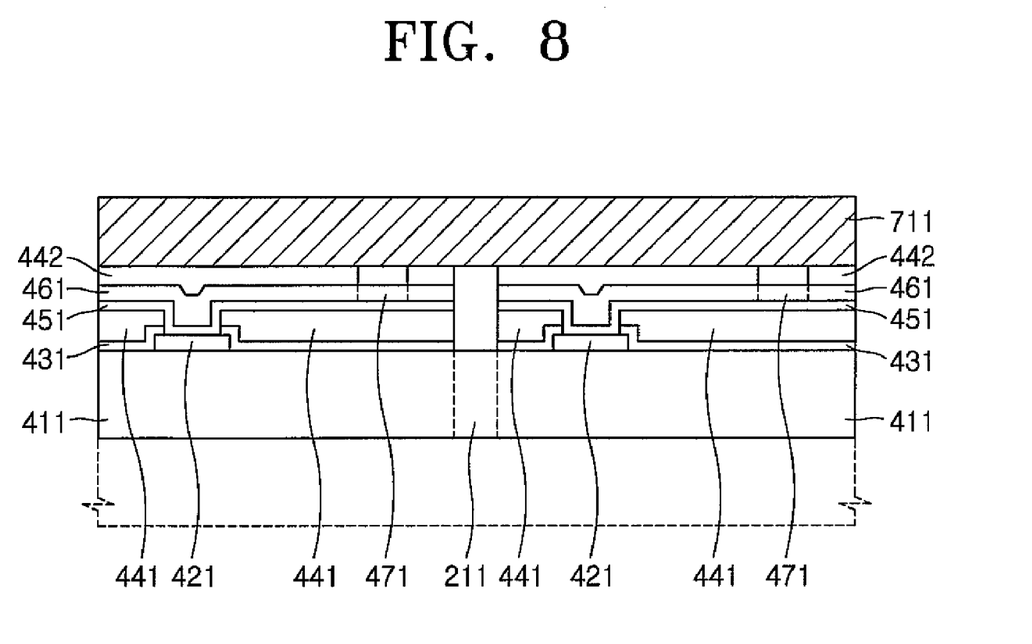

Referring to FIG. 8, the backside of wafer 201 is removed until wafer 201 is sufficiently thin. That is, a predetermined thickness of wafer 201 is removed (e.g., ground or polished away) from the backside of wafer 201. If wafer-level-chip-scale package 205 of FIG. 4 is relatively thinner, the overall size of a product incorporating wafer-level-chip-scale package 205 may be reduced. Since wafer 201 is fixed to temporary supporting board 711, the predetermined thickness from the backside of wafer 201 may be easily reduced, as desired.

Figure 9:
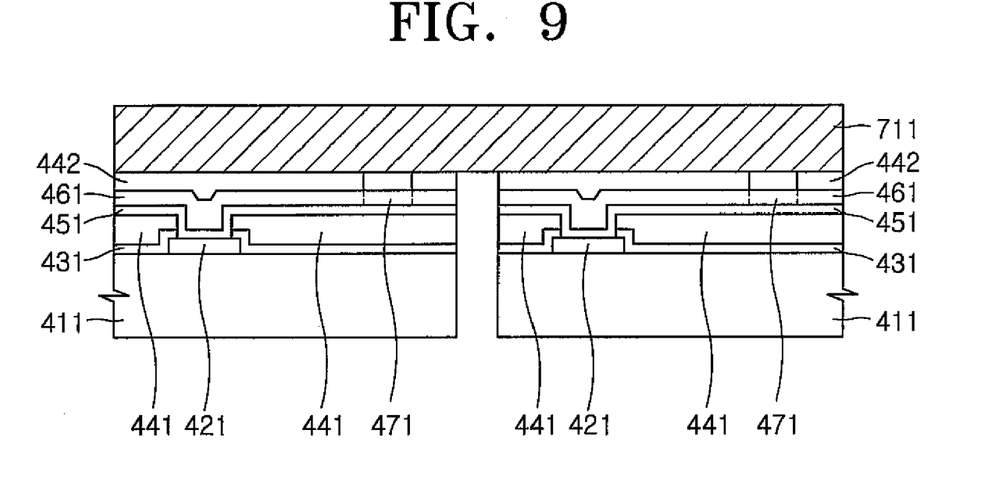

Referring to FIG. 9, wafer 201 is now cut, for example, along subscribe lines 211 shown in FIG. 6 in order to separate individual wafer-level-chip-scale package 205 through the backside of wafer 201. Temporary supporting board 711 is, however, not cut at this time. Therefore, the separated semiconductor substrates 411 still retain the mechanical support provided by temporary supporting board 711.

Figure 10:
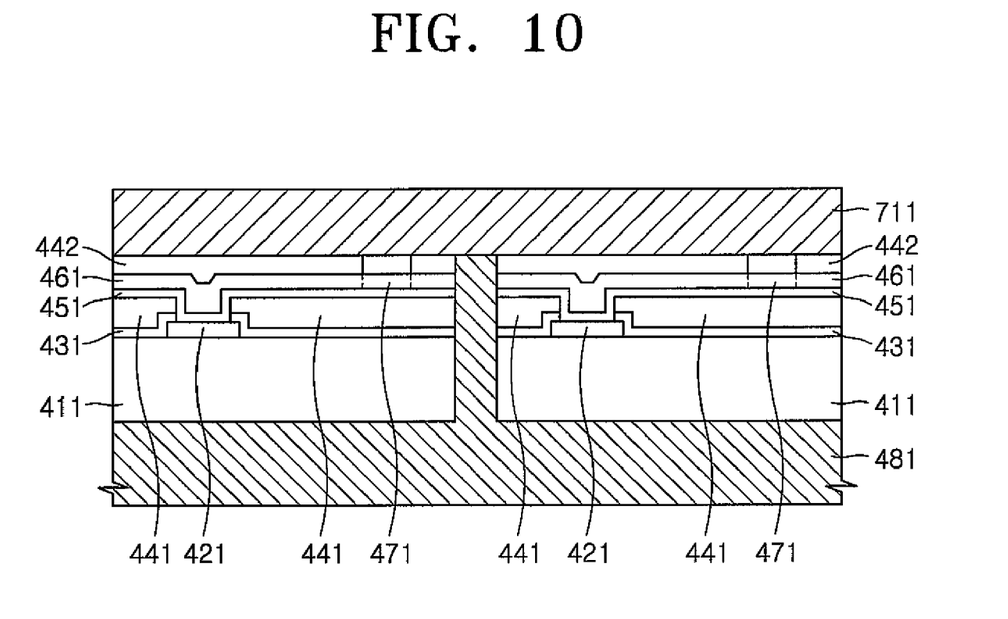

Referring to FIG. 10, protective portion 481 is formed on the entire backside of wafer 201. In the illustrated example, the backside of wafer 201 is molded into an insulating material having high strength, such as an epoxy molding compound. During this molding process, the molding compound is pressed onto the side surfaces of the respective semiconductor substrates 411 as well as the respective bottom surfaces.

Figure 11:
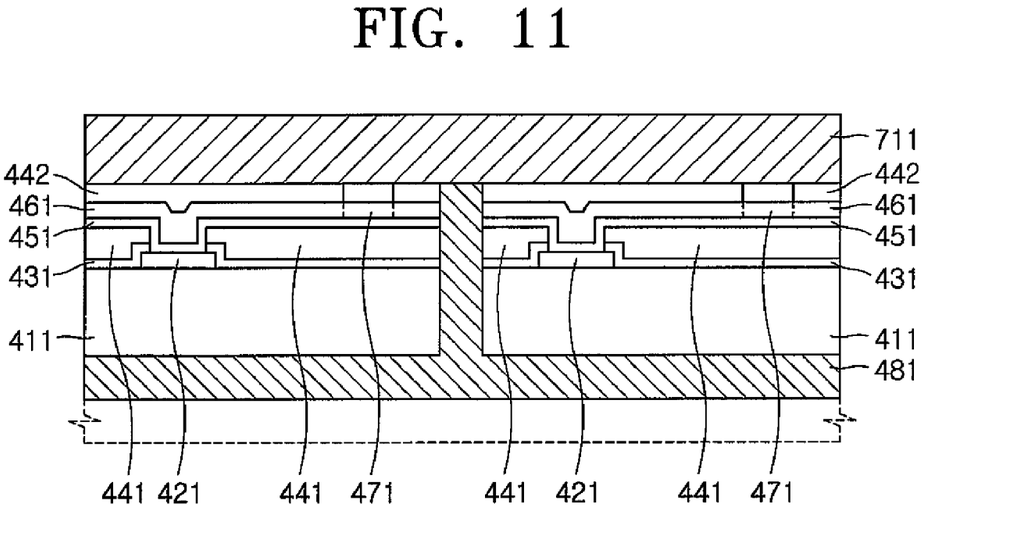

Referring to FIG. 11, the backside of wafer 201 is again thinned (e.g., by grinding or polishing away a portion of the adhering insulating material). In this manner wafer 201 is thinned to a final desired thickness.

Figure 12:
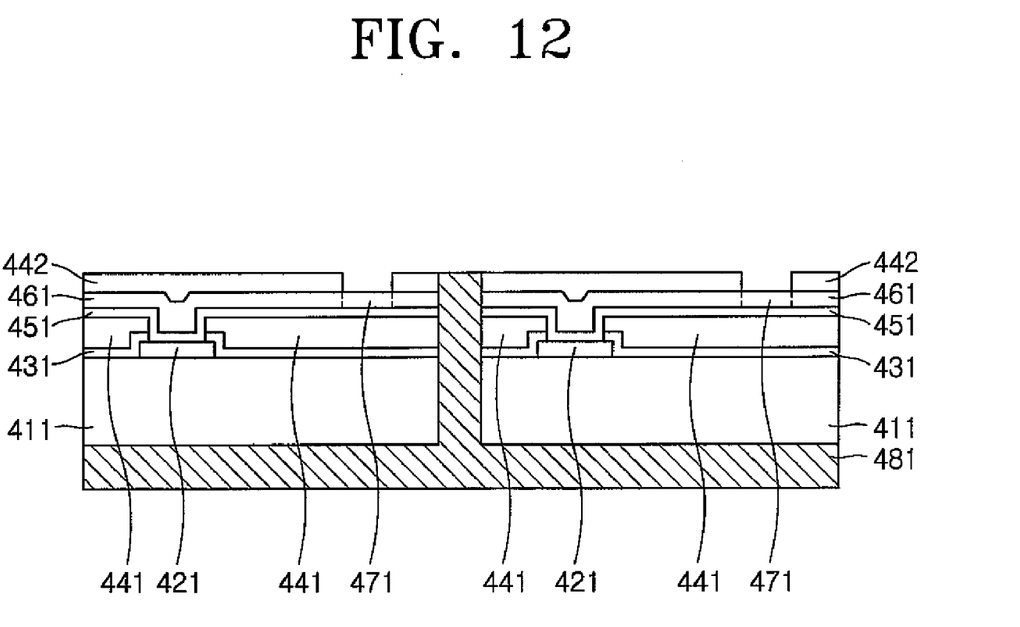

Referring to FIG. 12, temporary supporting board 711 is removed from wafer 201, and wafer 201 is cleaned. Since the backside of wafer 201 is supported by protective portion 481, semiconductor substrates 411 are yet separated from one another when temporary supporting board 711 is removed. When temporary supporting board 711 is removed, adhesive material of the temporary supporting board 711 or foreign matter that may have been attached to the topside of wafer 201. This adhesive or foreign matter must be removed by a competent cleaning process.

Figure 13:
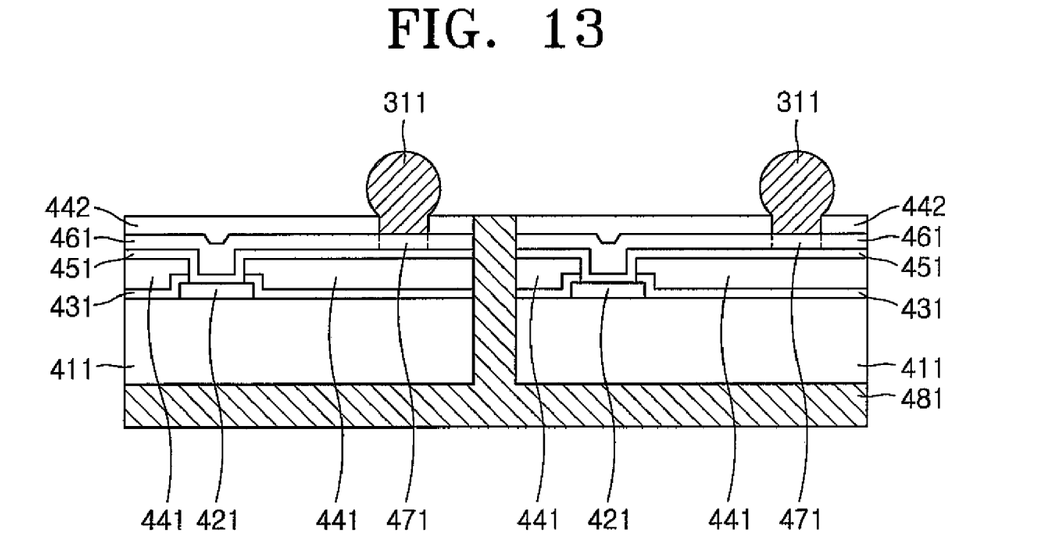
Figure 14:
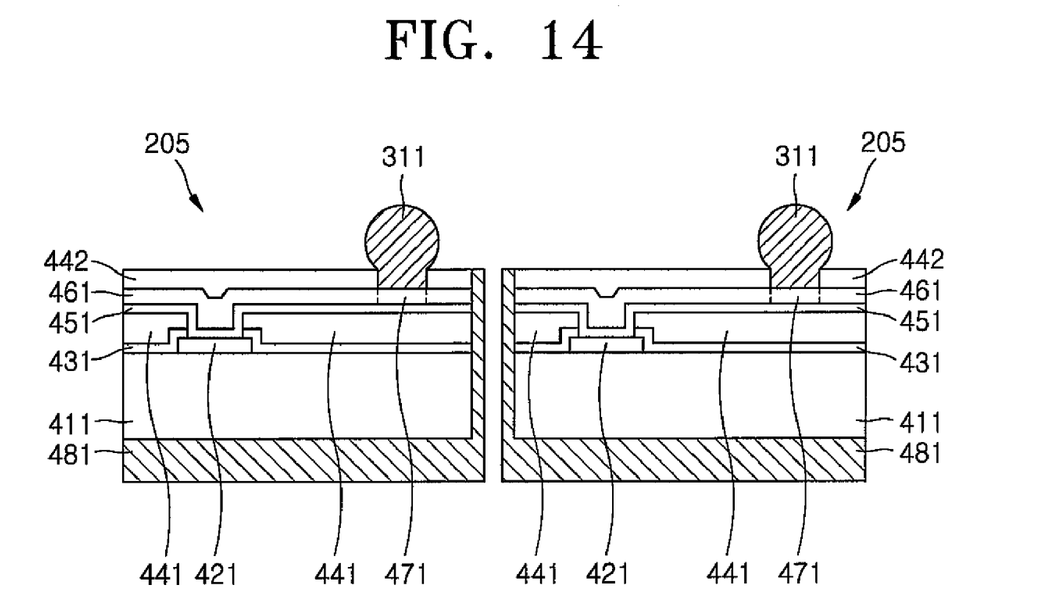

Referring to FIG. 13, conductive balls 311 are adhered to ball pads 471. Instead of balls 311, bumps, composed of metal such as copper, gold, or nickel, may be formed.

Referring to FIG. 14, wafer 201 is again cut such that semiconductor substrates 411 are separated from one another. As a result, the wafer-level-chip-scale packages 205 are complete.

As described above, since a protective portion with high strength is formed on bottom and side surfaces of a wafer-level-chip-scale package, these surfaces are not easily broken by an external impact. In addition, due to the protective portion formed on a backside of the wafer-level-chip-scale package, the wafer-level-chip-scale package is not easily broken, even when it is relatively thin. Therefore, the wafer-level-chip-scale package can be employed in any product that requires a thin wafer-level-chip-scale package without any problems.

While the invention has been particularly shown and described with reference to exemplary embodiments thereof, it will be understood by those of ordinary skill in the art that various changes in form and details may be made therein without departing from the scope of the invention as defined by the following claims.

What is claimed is:

1. A method of fabricating a wafer-level-chip-scale package, the method comprising:
    preparing a wafer comprising a plurality of semiconductor substrates, each semiconductor substrate comprising an integrated circuit and a ball pad connected to the integrated circuit;
    attaching a temporary supporting board to a topside of the wafer;
    separating the plurality of semiconductor substrates on the temporary supporting board by selectively cutting a backside of the wafer while not cutting through the temporary supporting board;
    molding the backside of the wafer with an insulating material;
    removing the temporary supporting board;
    forming a conductive ball on the topside of the wafer in electrical contact with the ball pad; and
    cutting the insulating material to separate the plurality semiconductor substrates.

2. The method of claim 1, wherein the preparing the wafer comprises removing a predetermined thickness from the backside of the wafer following fabrication of the integrated circuit and ball pad.

3. The method of claim 1, further comprising:
    removing a predetermined thickness of the insulating material following molding the backside of the wafer.

4. The method of claim 1, wherein, the insulating material comprises an epoxy molding compound.

5. The method of claim 1, further comprising:
    cleaning the topside of the wafer following removal of the temporary supporting board.

6. The method of claim 1, wherein the conductive ball is formed from solder.

7. The method of claim 1, wherein preparing the wafer comprises:
    for each semiconductor substrate,
    fabricating the integrated circuit on the semiconductor substrate and forming the bonding pad in electrical connection with the integrated circuit;
    forming a protective layer on edges of the bonding pad and on the semiconductor substrate;
    forming a first insulation layer on the protective layer;
    forming an under barrier metal on the first insulation layer and the bonding pad;
    forming a distribution layer on the under barrier metal;
    forming a second insulation layer on distribution layer; and
    forming the ball pads on exposed portions of the second insulation layers.

* * * * *